(12) United States Patent
Hunter et al.

(10) Patent No.: US 8,254,767 B2
(45) Date of Patent: Aug. 28, 2012

(54) METHOD AND APPARATUS FOR EXTENDED TEMPERATURE PYROMETRY

(75) Inventors: Aaron M. Hunter, Santa Cruz, CA (US); Jiping Li, Palo Alto, CA (US); Rajesh S. Ramanujam, Cupertino, CA (US); Thomas Haw, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 394 days.

(21) Appl. No.: 12/547,605

(22) Filed: Aug. 26, 2009

(65) Prior Publication Data

US 2010/0054720 A1 Mar. 4, 2010

Related U.S. Application Data

(63) Continuation of application No. 12/547,605, filed on Aug. 26, 2009.

(60) Provisional application No. 61/112,477, filed on Nov. 7, 2008, provisional application No. 61/092,964, filed on Aug. 29, 2008.

(51) Int. Cl.
*A21B 2/00* (2006.01)
(52) U.S. Cl. .......... 392/416; 392/407; 392/418
(58) Field of Classification Search .......... None
See application file for complete search history.

(56) References Cited

U.S. PATENT DOCUMENTS

| | | | |
|---|---|---|---|
| 3,619,059 A * | 11/1971 | Muller et al. | 356/45 |
| 3,715,922 A | 2/1973 | Menge | |
| 3,922,550 A | 11/1975 | Crowley et al. | |
| 3,992,943 A | 11/1976 | Schiefer et al. | |
| 4,470,710 A | 9/1984 | Crane et al. | |
| 4,579,461 A | 4/1986 | Rudolph | |
| 5,125,739 A | 6/1992 | Suarez-Gonzalez et al. | |
| 5,154,512 A * | 10/1992 | Schietinger et al. | 374/9 |
| 5,271,084 A * | 12/1993 | Vandenabeele et al. | 392/416 |
| 5,755,511 A | 5/1998 | Peuse et al. | |
| 5,830,277 A * | 11/1998 | Johnsgard et al. | 118/725 |
| 5,938,335 A * | 8/1999 | Yam | 374/124 |
| 6,007,241 A | 12/1999 | Yam et al. | |
| 6,035,100 A * | 3/2000 | Bierman et al. | 392/416 |
| 6,044,203 A * | 3/2000 | Dawson et al. | 392/416 |
| 6,151,446 A | 11/2000 | Hunter et al. | |
| 6,179,466 B1 | 1/2001 | Peuse et al. | |
| 6,183,130 B1 | 2/2001 | Adams et al. | |
| 6,200,634 B1 * | 3/2001 | Johnsgard et al. | 427/248.1 |

(Continued)

FOREIGN PATENT DOCUMENTS

JP 2007-183207 7/2007

OTHER PUBLICATIONS

PCT International Search Report, PCT/US09/55162, mailed Feb. 16, 2010, 7 pgs.

(Continued)

*Primary Examiner* — Thor Campbell
(74) *Attorney, Agent, or Firm* — Diehl Servilla LLC

(57) ABSTRACT

Embodiments of the invention are directed to methods and apparatus for rapid thermal processing of a substrate over an extended temperature range, including low temperatures. Systems and methods for using an extended temperature pyrometry system employing a transmitted radiation detector system are disclosed. Systems combining transmitted radiation detector systems and emitted radiation detector systems are also described.

20 Claims, 14 Drawing Sheets

U.S. PATENT DOCUMENTS

| | | |
|---|---|---|
| 6,376,804 B1 | 4/2002 | Ranish et al. |
| 6,406,179 B2 | 6/2002 | Adams et al. |
| 6,775,471 B2 | 8/2004 | Blersch et al. |
| 6,839,507 B2 | 1/2005 | Adams et al. |
| 6,847,012 B1 | 1/2005 | Hauf |
| 7,075,629 B2 | 7/2006 | Bonne et al. |
| 7,103,271 B2 * | 9/2006 | Kanazaki et al. ............. 392/416 |
| 7,112,763 B2 | 9/2006 | Hunter et al. |
| 2003/0236642 A1 * | 12/2003 | Timans ........................... 702/99 |
| 2004/0065657 A1 | 4/2004 | Adams et al. |
| 2006/0086713 A1 | 4/2006 | Hunter et al. |
| 2006/0291834 A1 * | 12/2006 | Hauf et al. .................... 392/416 |
| 2008/0217306 A1 * | 9/2008 | Adams et al. ............ 219/121.62 |
| 2009/0200279 A1 * | 8/2009 | Li ............................ 219/121.66 |
| 2009/0323759 A1 * | 12/2009 | Govindaraju et al. ........ 374/123 |
| 2010/0003020 A1 * | 1/2010 | Ranish et al. ................. 392/416 |
| 2010/0054720 A1 * | 3/2010 | Hunter et al. ................. 392/416 |

OTHER PUBLICATIONS

PCT Written Opinion, PCT/US09/55162, mailed Feb. 16, 2010, 3 pgs.

* cited by examiner

METHOD AND APPARATUS FOR EXTENDED TEMPERATURE PYROMETRY

CROSS REFERENCE TO RELATED APPLICATION

This application claims the benefit of priority under 35 U.S.C. §119(e) to U.S. Patent Application No. 61/092,964, filed Aug. 29, 2008 and U.S. Patent Application No. 61/112,477, filed Nov. 7, 2008, which are hereby incorporated by reference in their entirety.

TECHNICAL FIELD

The invention relates generally to extended temperature pyrometry, which can be used in the processing of semiconductor wafers. More specifically, the invention relates to rapid thermal processing (RTP) of silicon wafers and extended temperature, including low temperature, pyrometry techniques used in RTP.

BACKGROUND

Rapid thermal processing (RTP) is a term applied to several types of thermal processes including annealing, dopant activation, oxidation, and nitridation among others. The aforementioned processes are typically performed at relatively high temperatures above about 1000° C. It can be further applied to etching and chemical vapor deposition in the presence of precursor or etching gases. The latter processes are conventionally performed in an RTP chamber at somewhat lower temperatures of between 500° C. and 800° C. RTP typically depends upon an array of high-intensity incandescent lamps fit into a lamphead and directed at the substrate being processed. The lamps are electrically powered and can be very quickly turned on and off and a substantial fraction of their radiation can be directed to the substrate. As a result, the wafer can be very quickly heated without substantially heating the chamber and thereafter can be nearly as quickly cooled once the power is removed from the lamps. Thereby, the processing time at a predetermined temperature can be more closely controlled and the total thermal budget can be reduced. Furthermore, the total processing time can be reduced, thereby increasing throughput.

FIG. 1 schematically illustrates in cross section an RTP reactor 10 described by Ranish et al. in U.S. Pat. No. 6,376,804, and is generally representative of the Radiance RTP reactor available from Applied Materials, Inc. of Santa Clara, Calif. The reactor 10 includes a processing chamber 12, a wafer support 14 located within the chamber 12, and a lamphead 16 or heat source assembly located on the top of the chamber 12, all generally symmetrically arranged about a central axis 18.

The processing chamber includes a main body 20 and a window 22 resting on the main body 20. The window 22 is made of a material that is transparent to infrared light, for example, clear fused silica quartz.

The main body 20 is made of stainless steel and may be lined with quartz (not shown). An annular channel 24 is formed near the bottom of the main body 20. The wafer support 14 includes a rotatable magnetic rotor 26 located within the channel 24. A quartz tubular riser 28 rests on or is otherwise coupled to the magnetic rotor 26 and a support member 30 shown as an edge ring, which may be composed of silicon-coated silicon carbide, opaque silicon carbide or graphite rests on the riser 28. During processing, a wafer 32 or other substrate rests on the edge ring 30. A rotatable magnetic stator 34 is located externally of main body 20 in a position axially aligned with the magnetic rotor 24 and is magnetically coupled to it through the main body 18. An unillustrated motor rotates the magnetic stator 34 about the central axis 18 and thereby rotates the magnetically coupled rotor 26 and hence rotates the edge ring 28 and the supported wafer 30. Three or four lift pins 36 are slidably sealed to a reflector plate 38 forming a bottom wall of the main body 20. An unillustrated mechanism lifts and lowers all the lift pins 36 to selectively engage the wafer 22 to lower and raise it to and from the edge ring 30 and to and from a unillustrated paddle used to transfer of the wafer 22 into and out of the chamber 12.

The quartz window 22 rests on an upper edge of the main body 18 and an O-ring 40 located between the window 22 and the main body 20 provides an air-tight seal between them. The lamphead 16 overlies the window 22. Another second O-ring 42 located between the window 22 and the lamphead 16 provides an airtight seal between them. Clamps 44 in conjunction with the O-rings 40, 42 thus seals the lamphead 16 to the main body 20.

The lamphead 16 includes a plurality of lamps 46 that are supported by and electrically powered through electrical sockets 48. These are also referred to as a radiant heat source. The lamps 46 are preferably high-intensity incandescent lamps that emit strongly in the infrared such as tungsten halogen bulb having a tungsten filament inside a quartz bulb filled with a gas containing a halogen gas such as bromine and diluted with an inert gas to clean the quartz bulb. Each bulb is potted with a ceramic potting compound 50, which is relatively porous. The lamps 46 are located inside vertically oriented cylindrical lamp holes 52 formed in a reflector body 54. The open ends of the lamp holes 52 of the reflector body 54 are located adjacent to the window 22 with the lamps 46 separated from the window 22.

A liquid cooling channel 56 is formed within the reflector body 54 to surround each of the lamp holes 52. A coolant, such as water, introduced into the cooling channel 56 via an inlet 60 and removed at an outlet 62, cools the reflector body 54 and flowing adjacent the lamp holes 52 cools the lamps 46.

Thermal sensors such as seven or more pyrometers 70 are optically coupled by light pipes 72, such as sapphire rods, to respective apertures 74, which are formed through and are disposed and spaced across the radius of the reflector plate 38. Typically the rigid sapphire light pipes 72 and pyrometers are supported in the main body 20 but there may be an intermediate flexible optical fiber or light guide. The pyrometers 70 detect a temperature or other thermal property of a different radial portion of the lower surface of the wafer 30 and edge ring 30, as Peuse et al. describe in U.S. Pat. No. 5,755,511. Adams et al. describe such a pyrometer in U.S. Pat. No. 6,406,179. The pyrometer 70 is more particularly a radiation pyrometer and includes an optical narrow-band filter having a bandpass of about 20 nm at a wavelength less than 950 nm, that is, at a photon energy somewhat above the silicon band gap of about 1.1 eV (1.1 µm), alternately expressed as photon wavelength below the band gap wavelength of the silicon wafer. Such filters are easily formed as multi-layer interference filters. Thereby, the silicon wafer 32 absorbs the shorter-wavelength visible radiation emitted from the lamps 46 so that the pyrometer 70 is sensitive to the blackbody radiation emitted from the wafer 32 rather than the radiation from the lamps 46.

The pyrometers 70 supply temperature signals to a lamp power supply controller 76, which controls the power supplied to the infrared lamps 46 in response to the measure temperatures. The infrared lamps 46 may be controlled in radially arranged zones, for example, fifteen zones, to provide a more tailored radial thermal profile to account for thermal edge effects. The pyrometers 72 together provide signals indicative of a temperature profile across the wafer 22 to the power supply controller 76, which controls the power supplied to each of the zones of the infrared lamps 46 in response to the measured temperatures, thus providing a closed loop thermal control.

The main body 20 of the processing chamber 12 includes a processing gas inlet port 80 and a gas outlet port 82. In use, the pressure within the processing chamber 12 can be reduced to a sub-atmospheric pressure prior to introducing a process gas through the inlet port 80. A vacuum pump 84 evacuates the process chamber 86 by pumping through a port 76 and a valve 88. The pressure is typically reduced to between about 1 and 160 torr. Certain processes, however, can be run at atmospheric pressure, though often in the presence of a specified gas, and the process chamber does not need to be evacuated for such processes.

A second vacuum pump 90 reduces the pressure within the lamphead 16, particularly when the processing chamber is pumped to a reduced pressure to reduce the pressure differential across the quartz window 22. The second vacuum pump 90 reduces the pressure within the lamphead 16 by pumping though a port 92 including a valve 94. The port 92 is in fluid communication with an interior space of the reflector body 54 including the lamp holes 52.

A pressurized source 98 of a thermally conductive gas, such as helium, fills the lamphead 16 with the thermally conductive gas to facilitate thermal transfer between the lamps 46 and the liquid cooling channels 56. The helium source 98 is connected to the lamphead 16 through a valve 100 and port 102. The thermally conductive gas is introduced into a gas manifold 104 formed between a lamphead cover 106 and the base of each lamp 46. Opening the valve 100 causes the gas to flow into the manifold 104. Since the lamp potting compound 50 is relatively porous, the thermally conductive gas flows through the potting compound 50 and in the gap between the walls of the lamp 46 and the lamp hole 52 to cool the lamps 46.

The described RTP chamber, however, suffers some drawbacks in its use at lower temperatures. The typical radiation pyrometer used for silicon RTP includes a silicon photodiode detector, which detects the intensity of usually a narrow bandwidth of the Planckian radiation spectrum emitted from a hot body and determines the temperature of that body from the detected intensity. However, pyrometry is generally used for measuring high temperatures, for example, above 500° C. or 800° C. In the configuration of RTP reactors in which the chamber parts are relatively warm and there is light leakage from radiant bulb, conventional pyrometry is relatively ineffective at wafer temperatures of less than about 450° C. Photocurrents of a conventional pyrometer exposed to a 350° C. body are in the neighborhood of 0.8 pA, a level easily overwhelmed by thermal and electronic noise in a typical RTP environment. Furthermore, the wafer is partially transparent at these temperatures and the chamber is not light tight. It has been observed that immediately after the incandescent lamps are turned on in the presence of a cold wafer, the pyrometers immediately register about 350° C. from the direct and indirect lamp radiation.

Low-temperature control of wafer temperatures occurs in at least two situations for RTP. In high-temperature RTP, the higher wafer temperatures are very finely controlled by a closed loop control system using the radiation pyrometers, which, as explained above, are effective only above about 450° C. To reach this temperature, however, the wafer must first be heated under an open loop control system in which predetermined amounts of current are supplied to the radiant lamps. When the pyrometers detect that the temperature has reached a lower detection limit for the radiant pyrometers, thermal control switches to the closed loop system. The pre-heating during the open-loop period is not closely monitored beyond typically a switch off condition. As a result, temperature gradients or excessive heating rates may occur. The wafer may become misshapen during the pre-heating into a domed or potato-chip shape that prevents effective RTP at yet higher temperatures. It has thus been necessary to closely optimize the pre-heating conditions, particularly the distribution of zonal heating to achieve uniform pre-heating. Such pre-heating optimization has conventionally required a skilled engineer to experiment with a large number of wafer to establish a pre-heating recipe which avoids warpage or other deleterious results. However, the optimized recipe strongly depends on the features already established on the wafer. Except in the situation of very long production runs, it is infeasible to optimize for each level of each chip design. Instead, the optimization is performed on a few classes of unpatterned stock wafers having a top layer of a given type of material, for example, either metal or oxide. For production, the pre-heating recipe is selected for a similar top layer. Generally, this approach has proven unsatisfactory and results in uncertain pre-heating rates and other uniformities requiring yet further adjustments.

A demand has arisen for RTP performed at temperatures below 500° C. and even below 250° C. to nearly room temperature, for example, in nickel, cobalt, or titanium silicide contacts being envisioned for future generations of integrated circuits. It would be convenient to apply conventional radiation pyrometry to these advanced processes requiring relatively low thermal treatment temperatures. It is conceivable to design an automated low-temperature RTP chamber with cold walls and low-temperature radiation pyrometers, but it is more desirable to adapt commercialized high-temperature RTP chambers for low-temperature processing. It is further desired to provide an RTP chamber that can be used for both low-temperature and high-temperature processing so that the same chamber can be used for different processing steps.

Hunter et al. have described, in U.S. Pat. No. 6,151,446, a transmission pyrometer useful for determining when a wafer supported on lift pins induces enough photocurrent in a photodetector to generally indicate that the wafer has achieved a chamber temperature before the wafer is lowered onto the edge ring. The transmission pyrometer includes some sort of filtering effective within a band near the silicon band gap. As the silicon wafer warms up, its band gap energy decreases (wavelength increases). The transmission pyrometer is intended to detect the radiation from the radiant heating lamps, usually held at a low intensity, as filtered by the silicon wafer. As the silicon band gap passes into or out of the detector's bandwidth, the detector signal significantly changes, thereby providing an indication of the temperature of the silicon wafer. In U.S. Pat. No. 6,151,446, the transmission pyrometer was incorporated into the chamber's lift pins to determine when it is safe to lower the wafer onto the warm edge ring. It is described as operating only up to about 400° C. Although they system in U.S. Pat. No. 6,151,446 provides some feedback control of the lamp power, closer and finer control of wafer temperature is desired.

There is a need in the art for low-temperature measurement systems for rapid thermal processing which are free of matrix effects associated with a doped substrate.

SUMMARY

One or more embodiments of the invention are directed to rapid thermal processing apparatuses for processing a substrate having a front side and a back side. The apparatus comprises a chamber including a radiant heat source; a support member for holding the substrate during thermal processing in a position such that one of the front side and back side of the substrate faces the radiant heat source. The chamber also has a pyrometry system including a transmitted radiation detector system that measures radiation transmitted from a radiation source through the substrate at first and second discrete wavelengths and compares intensity of the transmitted radiation at the first discrete wavelength to the intensity of transmitted radiation at the second discrete wavelength.

In some embodiments, the radiation source is the radiant heat source and the transmitted radiation detector system comprises a first detector module for detecting the first discrete wavelength and a second detector module for detecting the second discrete wavelength. Other aspects of the invention also have at least one wavelength filter. Further aspects have the radiation source aligned with the pyrometry system.

In other embodiments, the radiation source comprises two discrete light sources and the detector system comprises a first detector module that measures radiation at the first and second discrete wavelengths. In some aspects, the radiation source comprises two discrete light sources and the detector system comprises a first detector module that measures radiation at the first discrete wavelength and a second detector module that measures radiation at the second discrete wavelength.

The wavelength filter according to some embodiments eliminates substantially all of the wavelengths outside the range of several nanometers below the lower of the first discrete wavelength and the second discrete wavelength to several nanometers above the higher of the first discrete wavelength and the second discrete wavelength. Other aspects have the at least one filter comprising a first wavelength filter and a second wavelength filter, the first wavelength filter having a bandpass wide enough to allow the first discrete wavelength to pass and a second wavelength filter having a bandpass wide enough to allow the second discrete wavelength to pass. Further embodiments have a filter that allows substantially all of the light around the first discrete wavelength to pass and gradually attenuates the transmission of light through the filter to 99.9% blocked at wavelengths about the second discrete wavelength. In other aspects the transmitted radiation detector system further comprises at least one wavelength filter effective to remove substantially all radiation having a wavelength less than a predetermined wavelength. In detailed embodiments, the predetermined wavelength is 980 nm.

Other embodiments further comprise an emission radiation detector system including a pyrometer for measuring radiation emitted from the substrate. Some aspects also have a beam splitter to separate a portion of the radiation emitted from the substrate from the radiation transmitted through the substrate.

Various embodiments of the invention have two discrete light sources operated either sequentially or simultaneously. In some detailed aspects, the first discrete wavelength is about 1030 nm and the second discrete wavelength is about 1080 nm. In other detailed aspects, the emission radiation detector is configured to measure the radiation at about 930 nm. The light sources for creating the discrete wavelengths in some aspects can be a laser, light-emitting diode, low power incandescent bulb or other suitable light source.

Further embodiments comprise a power supply control system coupled to the pyrometry system and adapted to control an amount of power delivered to the radiant heat source. In other embodiments, there is a plurality of transmitted radiation detector systems.

Additionally, embodiments of the invention are directed to methods of processing a substrate, including measuring a reference light intensity emitted from at least one light source at two discrete wavelengths using at least one pyrometry system at room temperature. The ratio of the room temperature intensities of the two discrete wavelengths is calculated. The substrate is placed into the chamber in a position between the at least one light source and the at least one pyrometry system. The light intensity is measured at the two discrete wavelengths transmitted from the at least one light source through the substrate using the pyrometry system. The ratio of the intensities of the two discrete wavelengths transmitted through the substrate is calculated and normalized to the intensity ratio at room temperature. The substrate is then heated using a radiant heat source while monitoring the temperature of the substrate by periodically measuring the ratio of the light intensity at the discrete wavelengths transmitted through the substrate using the pyrometry system.

DETAILED DESCRIPTION

Figure 1:
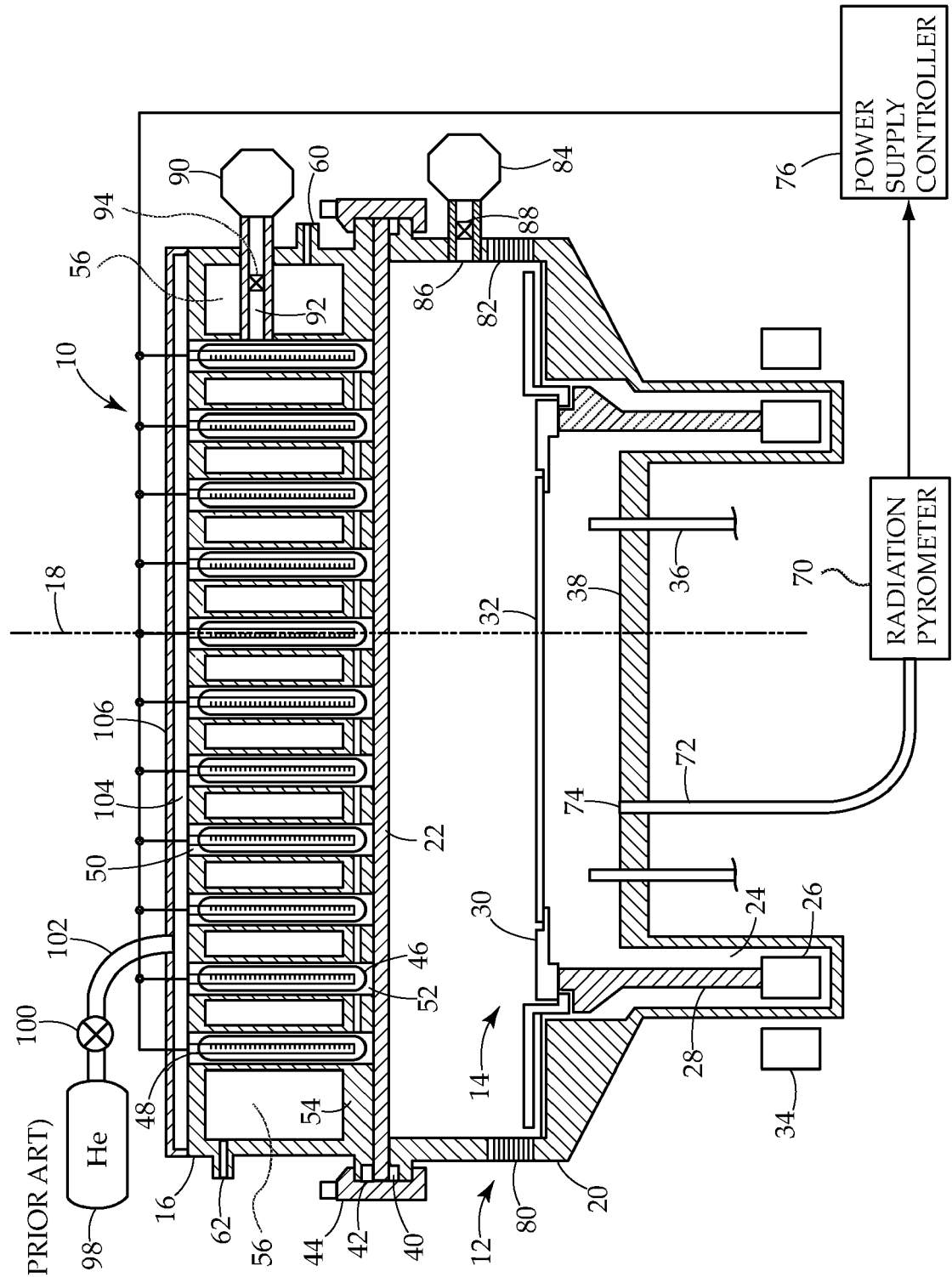
FIG. 1 is a schematic cross-sectional view of a conventional rapid thermal processing (RTP) chamber including at least one radiation pyrometer.

Before describing several exemplary embodiments of the invention, it is to be understood that the invention is not limited to the details of construction or process steps set forth in the following description. The embodiments described below can be employed singly or in combination with other embodiments. The invention is capable of other embodiments and of being practiced or being carried out in various ways.

As used in this specification and the appended claims, the singular forms "a", "an" and "the" include plural referents unless the context clearly indicates otherwise. Thus, for example, reference to "a substrate" includes a combination of two or more substrates, and the like.

One or more embodiments of the invention uses the temperature dependence of the bandgap energy of silicon to measure temperature. In one embodiment, the amount of energy transmitted through a silicon substrate is measured, where the source for the measurement is also the heating element in the chamber. In another embodiment, two measurements at two discrete wavelengths are obtained, and the ratio of the measurements are compared. These embodiments can minimize variation in transmission unrelated to the bandgap absorption (i.e., dopants, non-spectrally varying films), as well as compensating for source variation. In another embodiment, two discrete wavelength sources (LEDs or lasers) are fired sequentially, and the measurements are compared (for example, by time domain wavelength modulation). Each of these embodiments can be within an existing radiation pyrometer system, allowing temperature measurement from ambient temperature up to 1410° C. These embodiments are useful for measuring silicon substrates or thin films in the presence of high background radiation sources.

One aspect of the invention includes using a transmission pyrometer to measure temperatures of silicon wafers of less than 500° C. and even less than 250° C. in a rapid thermal processing chamber. Transmission pyrometers can detect discrete wavelengths of radiation from a light source as it is filtered by a silicon wafer. The absorption of the silicon in some wavelength bands strongly depends upon the wafer temperature and purity. The temperature measurement may be used for thermal processing at no more than such temperatures or may be used to control the pre-heating up to the point that a radiation pyrometer can measure the wafer temperature, for example, at 400 to 500° C., above which heating may be controlled by a closed loop using the radiation pyrometers.

A low-temperature transmission pyrometer useful below about 350° C. may be implemented with a silicon photodiode with little or no filtering in the wavelength band between 1 and 1.2 μm. A transmission pyrometer useful in a wavelength range extending to 500° C. includes an InGaAs diode photodetector and a filter blocking radiation above about 1.2 μm. Radiation and transmission pyrometers may be integrated into a structure including an optical splitter receiving radiation from a light pipe or other optical light guide and dividing the radiation into respective beams directed at the transmission pyrometer and the filter of the radiation pyrometer.

Figure 2:
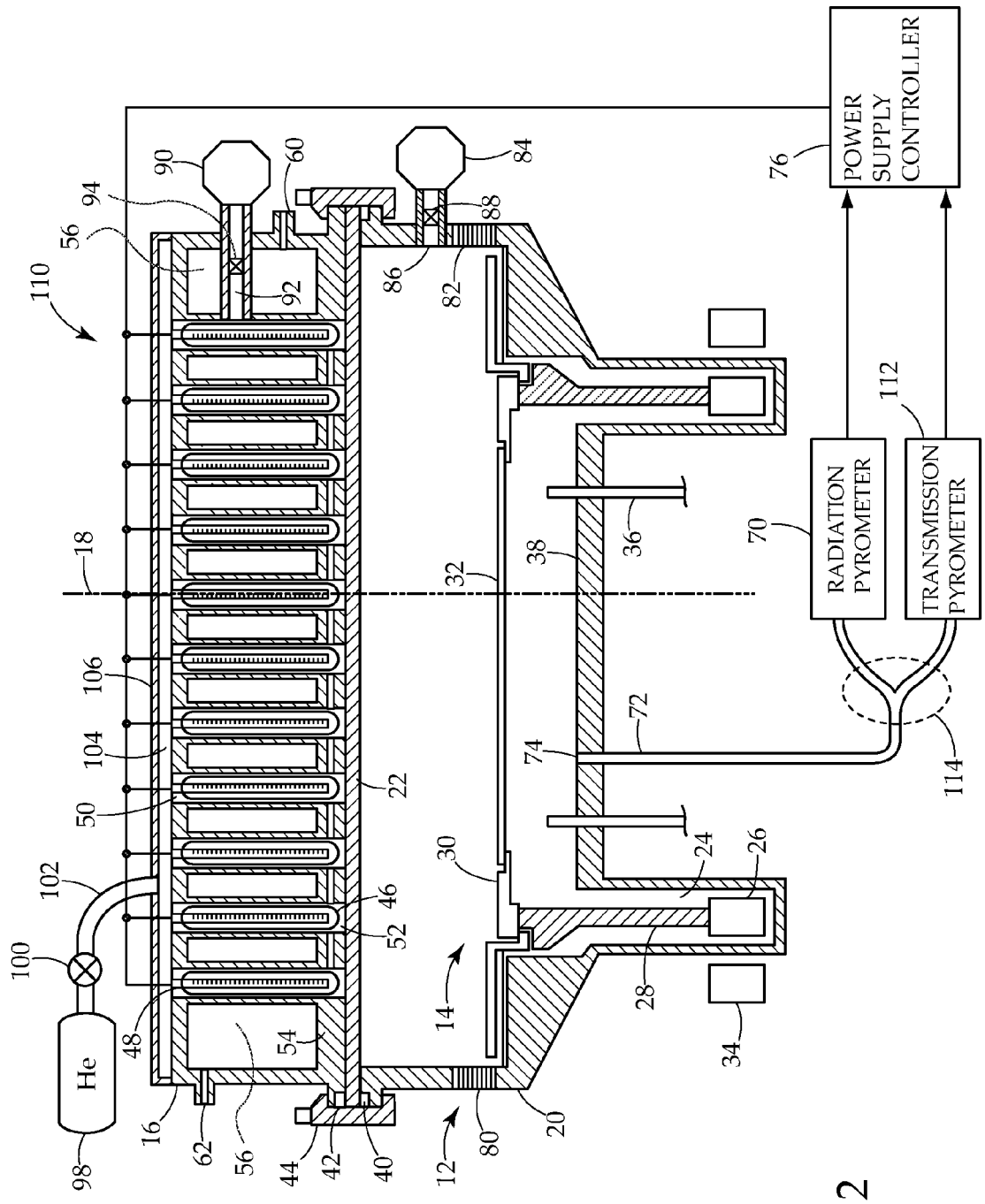
FIG. 2 is a schematic cross-sectional view of one embodiment of an RTP chamber including both a transmission pyrometer and a radiation pyrometer.

One embodiment of a rapid thermal processing (RTP) chamber 110 of the invention is schematically illustrated in the cross-sectional view of FIG. 2. It includes at least one transmission pyrometer. Although some aspects of the invention can be practiced with transmission pyrometry an embodiment of the inventive chamber 110 additionally includes one or more radiation pyrometers 70, 112. The two pyrometers 70, 112 may be included in a single system receiving optical radiation from the light pipe 72 and an optical splitter 114 divides the received radiation between the two pyrometers 70, 112. As mentioned previously, the radiation pyrometer 70 includes a narrow band filter at a sub-micron wavelength, that is, passing photons having energies greater than the silicon band gap. The radiation pyrometer 70 is thus effective at measuring the blackbody radiation temperature at the back side of the wafer 32 since the silicon wafer 32 blocks the shorter wavelength light from a radiant heat source, shown as lamps 46. On the other hand, the transmission pyrometer 112 is sensitive to longer-wavelength light, in particular light in the neighborhood of the silicon band gap at the wafer temperatures of interest or somewhat longer.

Figure 3:
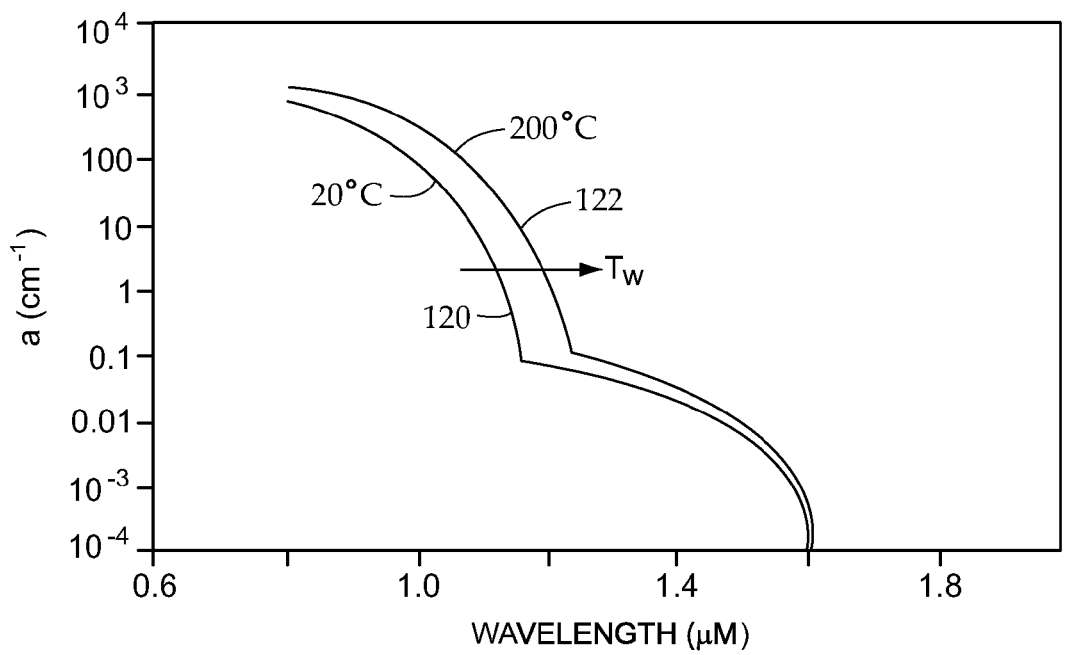
FIG. 3 is a graph showing the shift of the silicon absorption edge with temperature.

The transmissivity or transmission coefficient τ for optical radiation of a particular wavelength passing a uniform wafer is given by $$\tau(\alpha,\chi)=e^{-\alpha\chi}, \quad (1)$$

where α is the absorption coefficient and χ is the thickness of the wafer. The absorption coefficient of silicon near its band gap has a known temperature dependence, shown in the graph of FIG. 3 for room temperature (20° C.) as line 120 and 200° C. as line 122. The steeply sloping portions of lines 120, 122 are identified with the absorption edge of the optical band gap, which depends upon both the thermal change of the thermally activated free carriers and phonon contributions. The absorption edge shifts to longer wavelengths (smaller photon energies) with increasing wavelength.

The spectral filtering required for a transmission pyrometer is different from that for a radiation pyrometer. The transmission pyrometry filter and photodetector together provide a spectral response that needs to be sensitive to the wavelength of the absorption gap at the wafer temperatures of interest. This requirement varies according to whether the transmission pyrometer needs measure only low temperatures, for example, below about 350° C. and more particularly, below about 250° C. or whether temperatures up to 450° C. and somewhat above need to be measured. However, to maintain a reasonable signal-to-noise ratio, only a limited bandwidth of the blackbody radiation spectrum should be detected.

A silicon photodetector with no optical filtering can perform this function below about 250 or 350° C. A silicon photodetector is insensitive to radiation having a wavelength longer than about 1.1 μm. The wafer absorption edge is rising from 1 μm toward 1.2 μm as the wafer heats from room temperature to 350° C. Therefore, the net effect is a somewhat narrow pass band. However, at wafer temperatures higher than about 350° C., the absorption edge is beyond the detection limits of the silicon photodetector so that any further increases in the absorption edge wavelength are not readily detected. Thus, for operation with higher wafer temperatures, it is desired to use a photodetector sensitive to longer wavelengths. An example of such a detector is an InGaAs diode photodetector, which has a detection band between about 0.9 and 1.7 μm. In order to avoid that large contribution up to 1.7 μm, the InGaAs should be used with a low-pass filter passing wavelengths below 1.2 or 1.3 μm, that is, passing mostly radiation having a wavelength less than the band gap wavelength of the silicon wafer at the highest temperature measured by the transmission pyrometer and cutting off most of the Planckian spectrum above this band gap wavelength. Additionally, the filter may be a bandpass filter cutting off radiation below about 1 μm.

Figure 4:
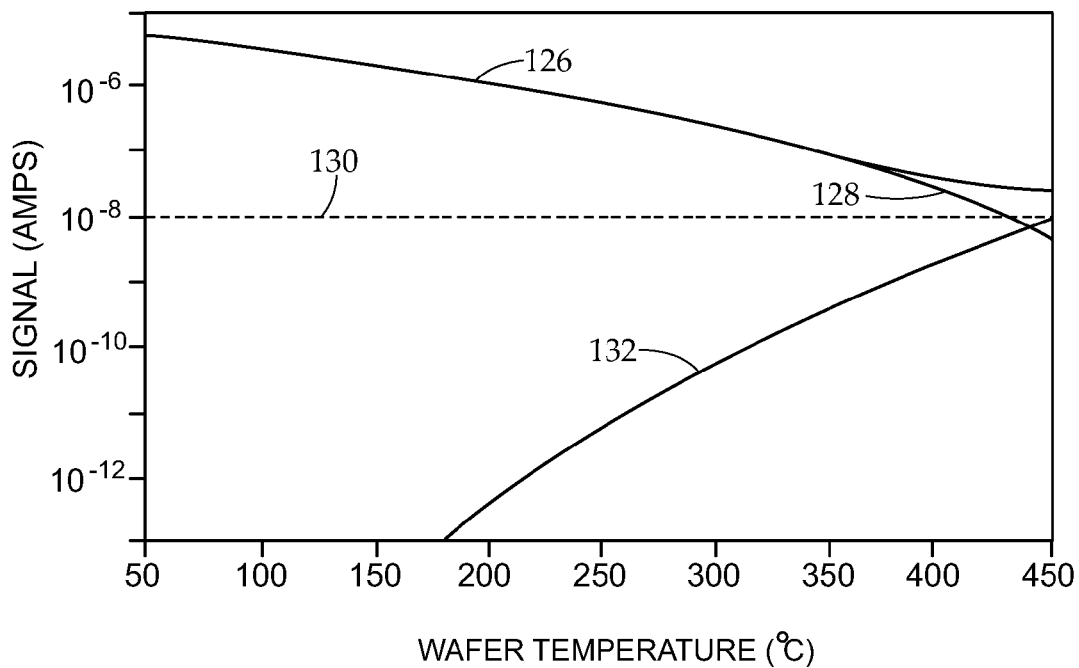
FIG. 4 is a graph illustrating the different contributions to the photocurrent in a transmission pyrometer as a function of wafer temperature.

The regime of operation is explained with reference to the graph of FIG. 4. Line 126 represents the total photocurrent from the transmission pyrometer as a function of wafer temperature for one setting of the lamp current. At the lower temperatures, the total photocurrent is principally a photocurrent 128 arising from the photon flux from the warm lamps and passing through the wafer. However, as represented by line 130, there is a constant background radiation, for example, stray radiation and warm chamber parts. At higher temperatures, there is an increasing contribution from the blackbody radiation of the wafer itself, represented by line 132. The cross over for the lamp and wafer blackbody contributions occurs at a temperature of about 400° C., which is near the lower end of the region at which the radiation pyrometer becomes effective.

One aspect of the invention depends upon a known dependence of the transmission pyrometer photocurrent upon lamp current and wafer temperature, which may be referred to as the pyrometer characteristics. The wafer thickness for production wafers is tightly controlled, for example, 0.75±0.02 mm for 300 mm wafers, and is thus assumed to be a known quantity.

Figure 5:
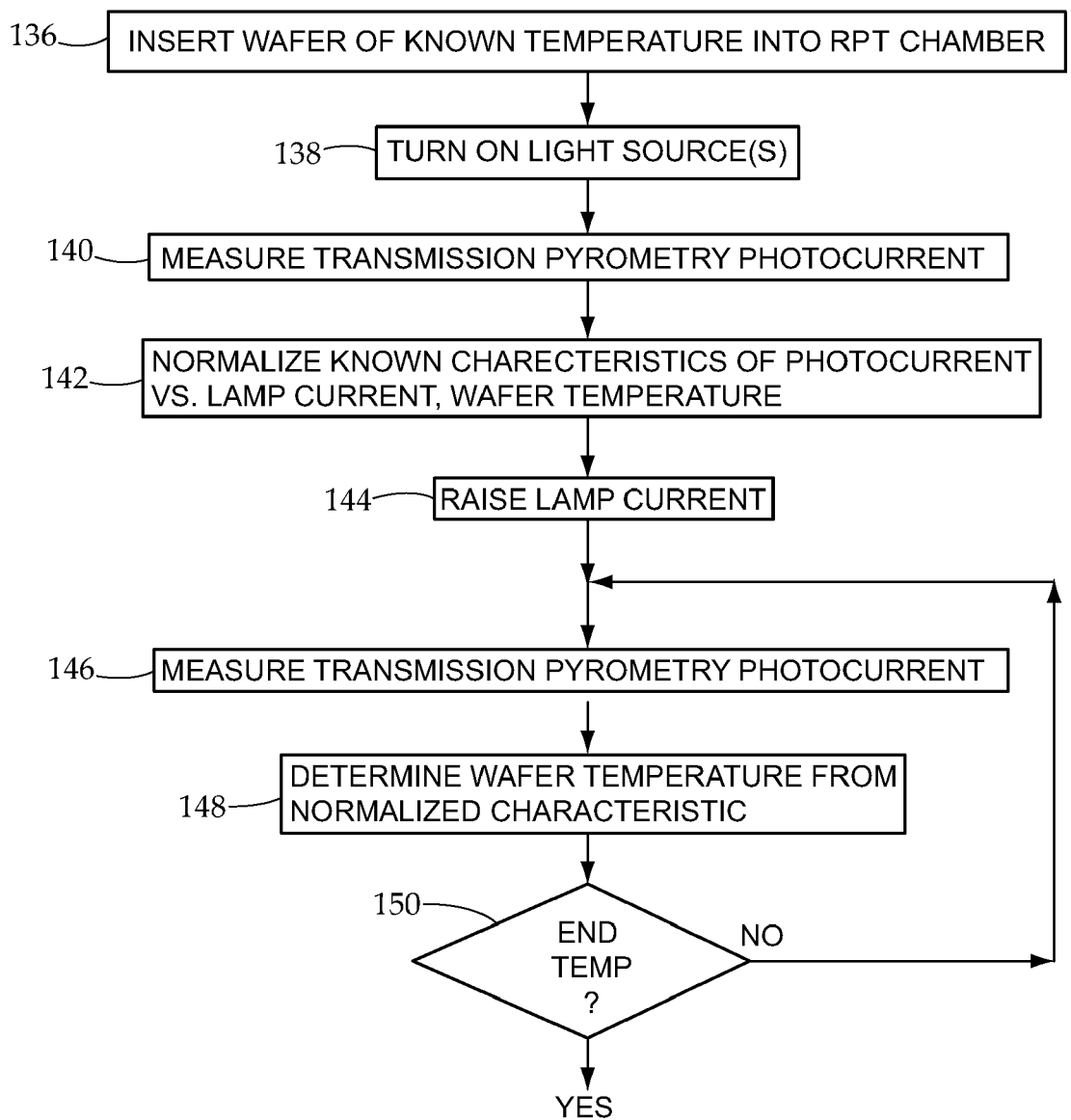
FIG. 5 is a process flow diagram for a fundamental method of using a transmission pyrometer to measure temperature of a wafer in an RTP chamber.

A basic algorithm for a controllable heating of the wafer is illustrated in the process flow diagram of FIG. 5. In step 136, a wafer of known temperature is inserted into the RTP chamber and in step 138 the light source(s) is/are directed at the wafer. In step 140, the photocurrent from the transmission pyrometer is measured. This measurement is done with known values of the lamp current and wafer temperature and enables the known characteristics to be properly normalized.

In step 142, the known but unnormalized characteristics of photocurrent vs. lamp and wafer temperature are normalized. This may be done in a number of ways, but the easiest procedure applies a scaling factor to the photocurrent output of the photodetector to bring the measured photocurrent in line with the value of the unnormalized photocurrent characteristic at the initial wafer and lamp temperatures. Thereafter, all measured photocurrent values are scaled.

Thereafter in step 144, the lamp current is raised to at least an initial pre-heat value. Thereafter, in step 146, the photocurrent from the transmission pyrometer is measured for the same wafer and the raised lamp current. In step 148, the wafer temperature is determined from the measured photocurrent and the normalized characteristics. Steps 146, 148 are repeated until it is determined in step 150 that some final pre-heat wafer temperature has been reached.

The required lamp and wafer characteristics can be established in a number of ways. It is possible to measure the pyrometer photocurrent for a large number of combinations of lamp current and wafer temperature and possibly wafer thickness and use these experimental values to thereafter relate photocurrent to wafer temperature. A normalization is still believed to be desirable to account for wafer variations and changes in the chamber conditions including different lamps, etc.

One approach relies upon a fairly complete understanding of the dependence of photocurrent upon electrical measurements of the lamps and the temperature dependence of transmittance through a silicon wafer and the response of the photodetector. The photocurrent $I_{PD}$ for a transmission pyrometer depends principally upon the wafer temperature $T_W$ and the lamp temperature $T_L$ and may be expressed as $$I_{PD} = \int_{\lambda_1}^{\lambda_2} R(\lambda, T_W, \chi) \cdot L(\lambda, T_L) d\lambda \quad (2)$$

where $\lambda_1$ and $\lambda_2$ are the limits of integration indicating the spectral limits of the responsiveness of the photodetector, which may extend from 0.8 to 1.7 μm, $R(\lambda)$ is the response function of the photodetector including any filter that is used, $L(\lambda, T_L)$ is the radiation intensity spectrum of the lamp at lamp temperature $T_L$, and $\Omega$ is a normalization factor to account for differences in background radiation, reflectivity on the top surface of the wafer, view factor of the transmission channel, and differences in the lamp radiation intensity. Proper normalization for reflectivity on the top wafer surface permits different types of wafers having different horizontal and vertical structures to be processed without separate optimization of the RTP pre-heating for each type of structure. Instead, the single normalization measurement in large part accounts for such differences which principally affect the top-surface reflectivity.

The lamp radiation intensity L is a function of the power dissipated in the lamp filament and hence of the temperature $T_L$ of the lamp, the emissivity $\epsilon_L(\lambda, T_L)$ of the material used for the filament, and a correction $\delta(\lambda, T_L)$ to the emissivity due to coiling of the lamp filament. The lamp temperature $T_L$ may be determined from an empirical expression for tungsten filaments given by $$T = \alpha R_L^{0.831}, \quad (3)$$

where $\alpha$ is a constant that may be determined by spectral measurements for radiation emitted by a class of lamps and $R_L$ is the resistance of the lamp filament, which may be determined by the instantaneous applied voltage and current feedback from the SCR drivers for the lamps. With the knowledge of the filament temperature, the radiation intensity of the lamps may be calculated from $$L(\lambda, T_L) = L_{BB}(\lambda, T_L) \epsilon(\lambda, T_L) \delta(\lambda, T_L), \quad (4)$$

where $L_{BB}$ is the Planckian blackbody radiation spectrum from a surface at temperature $T_L$, $$L_{BB}(\lambda, T) = \frac{c_1}{\lambda^5} (e^{c_2/\lambda T} - 1)^{-1}, \quad (5)$$

where $c_1$ and $c_2$ are the well known radiation constants having respective values of $3.742 \times 10^{-16}$ Wm$^2$ and 0.1439 mK. The emissivity $\epsilon$ of tungsten is well known as a function of both temperature and wavelength. The coiling and correction factor $\delta$ needs to be calculated or alternatively measured for each class of lamp.

The transmissivity $\tau$ through the silicon wafer having a thickness $\chi$ at temperature $T_W$ is given by $$\tau(\lambda, T_W, \chi) = e^{-\alpha(\lambda, T_W)\chi}, \quad (6)$$

where $\alpha$ is the absorption coefficient of silicon at wavelength $\lambda$ and temperature $T_W$. The absorption coefficient may be measured or can be calculated from the model described by Timans in "Emissivity of silicon at elevated temperatures," Journal of Applied Physics, vol. 74, no. 10, 15 Nov. 1993, pp. 6353-6364. The Timans model accounts for the absorption by phonons and free carriers and shows good agreement with measured absorptivity for lightly doped silicon. The Timans reference is also valuable for a general discussion of pyrometry.

Finding a closed expression which inverts the integral of Eqn. (2) to find wafer temperature based upon a measured photocurrent is computationally challenging and difficult to implement for real-time adjustment. Instead, it is preferred to compile a look-up table. For example, a two-dimensional table is constructed with lamp filament temperature $T_L$ on one axis and wafer temperature $T_W$ on the other axis. The calculated, unnormalized values of the photocurrent occupying the cells of the table.

The initial photocurrent measurement at a known wafer temperature $T_W$ and electrically measured lamp filament temperature $T_L$ correlates the unnormalized calculated photocurrent values in the table with a measured photocurrent and thus allows the normalization constant $\Omega$ to be determined for the entire table. Although it is possible to normalize all entries in the table, it is instead preferred to scale all measured photocurrents at the output of the photodetector by the now known normalization constant.

During processing of the wafer after the calibration step, the photocurrent from the transmission pyrometer is measured at known electrical measurement of the current and voltage of the lamp power supplies, which in view of Eqn. (3) provide a lamp temperature. The look-up table is then consulted to correlate the measured and scaled photocurrent at the known lamp temperature with a wafer temperature. Interpolation may be performed between tabulated photocurrents and, if necessary, between lamp temperatures. Other methods are available for storing and retrieving the characteristics of photocurrent versus lamp and wafer temperature. Each column of the table may be represented by the coefficients of a polynomial, power series, or other mathematical function relating photocurrent to wafer temperature for a given lamp temperature. Such a mathematical function is easily calculated on a real-time basis. Alternatively, the entire table could be converted to a two-variable power series. If desired, the polynomial or power series could include photocurrent as a variable with wafer temperature as the value of the polynomial.

Figure 6:
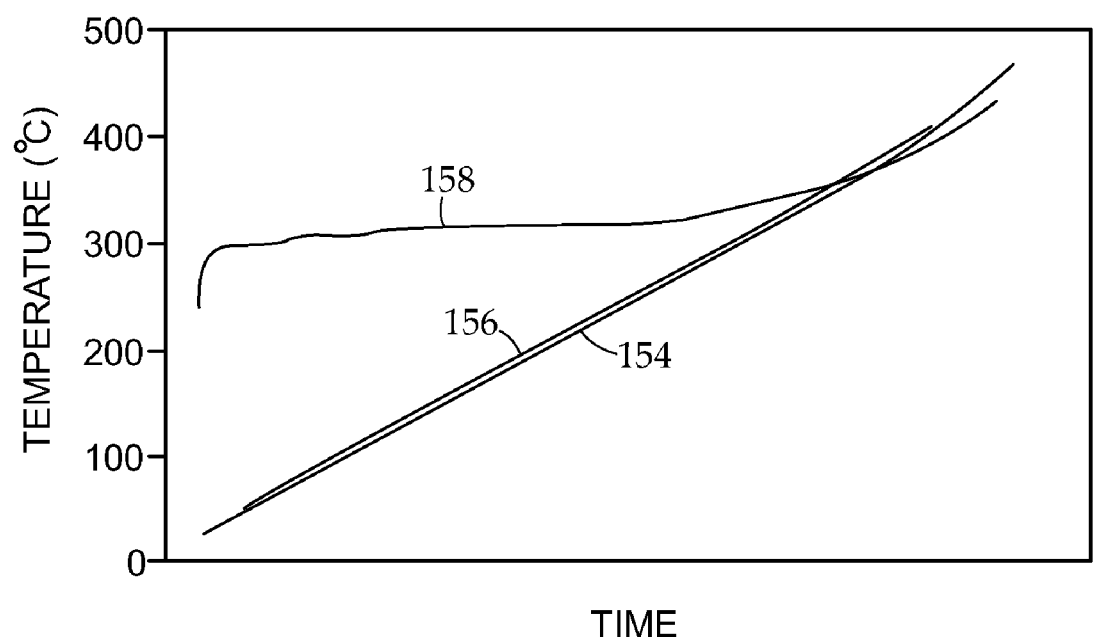
FIG. 6 is a graph comparing the performance of transmission and radiation pyrometers as a silicon wafer heats up.

The above description was verified with a silicon photodiode facing one of the lamps through the backside of the wafer and having a narrow field of view and no additional filtering beyond the approximate 1 μm lower limit of silicon photodiode and the absorption edge being below about 1.2 μm for the temperatures of interests. A separate conventional radiation pyrometer faced the same general area of the wafer but had a filter and a wider field of view. Additionally, a thermocouple was implanted in a bare wafer to measure its true temperature during the verification test. The results are shown in the graph of FIG. 6, which shows temperatures determined by different methods as a function of time after the lamps were turned on. Line 154 shows the temperature measured by the thermocouple. Line 156 shows the wafer temperature determined by the transmission pyrometer and operated in conjunction with the previously described look-up table. Line 158 shows the temperature determined by the conventional radiation pyrometer. At all temperatures, the transmission pyrometer measures a temperature relatively close to that of the thermocouple. At temperatures below about 300° C., the conventional radiation pyrometer fails to accurately measure the wafer temperature, but at higher temperatures its performance is adequate. As is further shown in FIG. 4, the transmission pyrometer of that design has a flattened response above about 350 or 400° C. Therefore, it is desirable to rely upon the transmission pyrometer at temperatures less than a transition temperature of about 350° C. and to rely upon the radiation pyrometer at higher temperatures. However, the transition temperature may vary depending upon the designs of the two pyrometers, but the present designs indicate a transition temperature of between 300 and 400° C.

Figure 7:
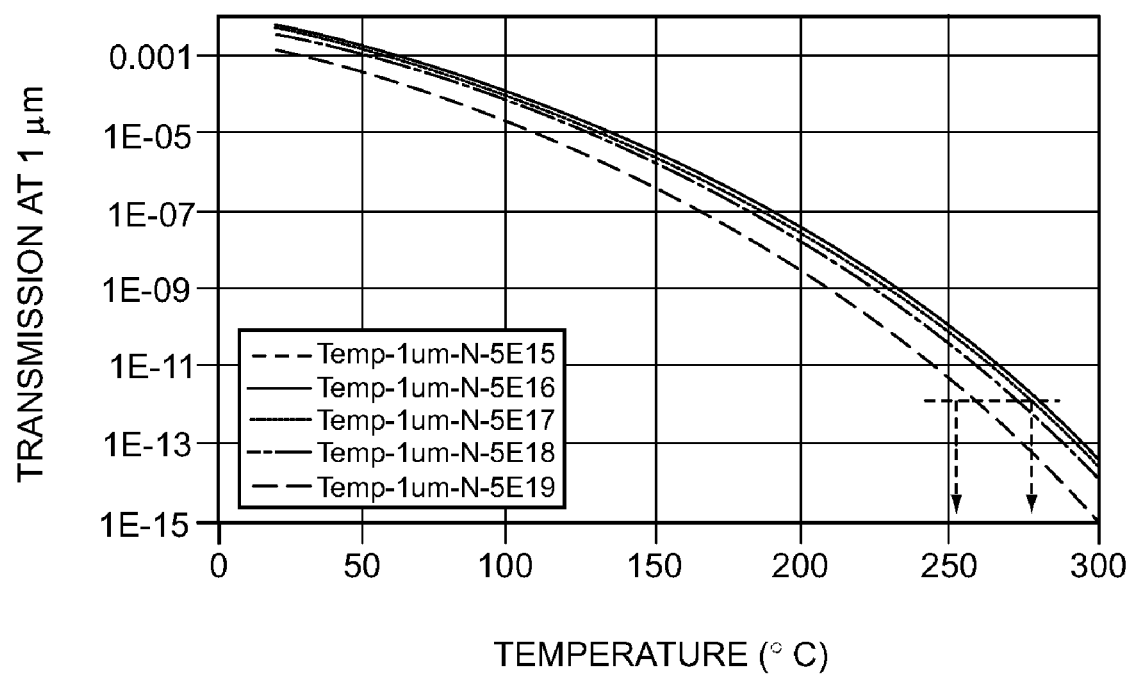
FIG. 7 shows a comparison of the transmission of light at 1 µm through n-type silicon wafers doped at various concentrations as a function of temperature.
Figure 8:
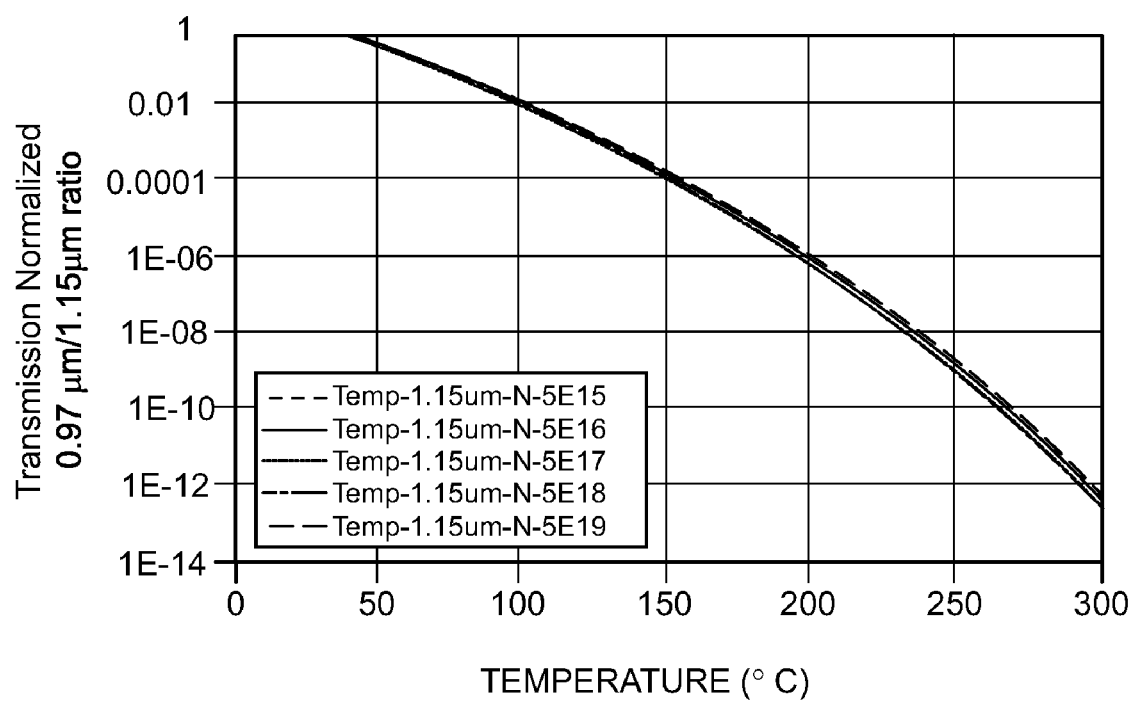
FIG. 8 shows a comparison of the ratio of light at 1.15 µm to light at 0.97 µm transmitted through n-type silicon wafers doped at various concentrations as a function of temperature.
Figure 9:
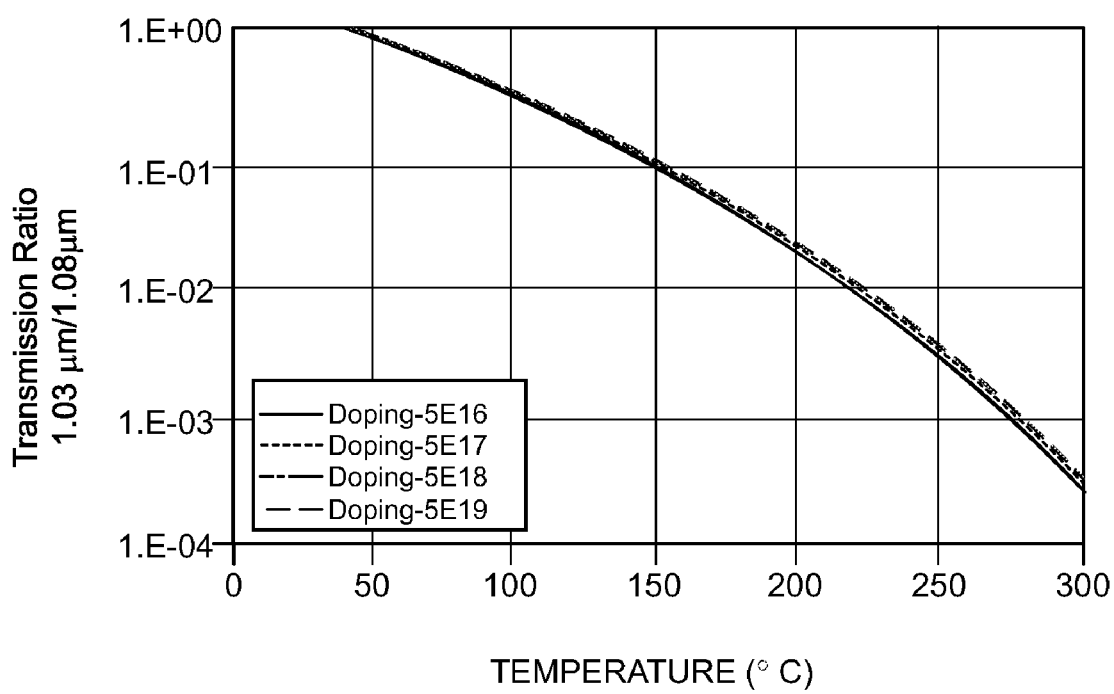
FIG. 9 shows a comparison of the ratio of light at 1.03 µm to light at 1.08 µm transmitted through n-type silicon wafers doped at various concentration as a function of temperature.

The curves of FIG. 6 shows the accuracy of temperature measurement using the transmission pyrometer through an undoped silicon wafer, at wavelengths between about 1 and 1.2 μm. FIG. 7 shows a graph of the transmission of light through n-type silicon wafers, doped at various concentrations. The transmitted light measured at a wavelength of 1 μm was recorded. It can be seen from this graph that the curvature of the transmission profile that doping concentrations up to about $10^{18}$ cm$^{-3}$ have fairly similar profiles. However, above this doping level there is a difference in the curvature of the profile. By using the dual wavelength measurements of the present invention, this curvature can be counteracted. FIG. 8 shows the resultant curves from the samples of FIG. 7 when measuring the ratio of light transmitted at two wavelengths, normalized to room temperature. FIG. 9 shows the resultant curves from selected samples from FIG. 7 when measuring the ratio of light transmitted at 1080 nm and 1030 nm, normalized to room temperature. It can be seen that the curvature of these samples remains nearly identical over the useful range of the transmission pyrometers, showing that the effect of doping can be effectively removed from consideration.

Figure 10:
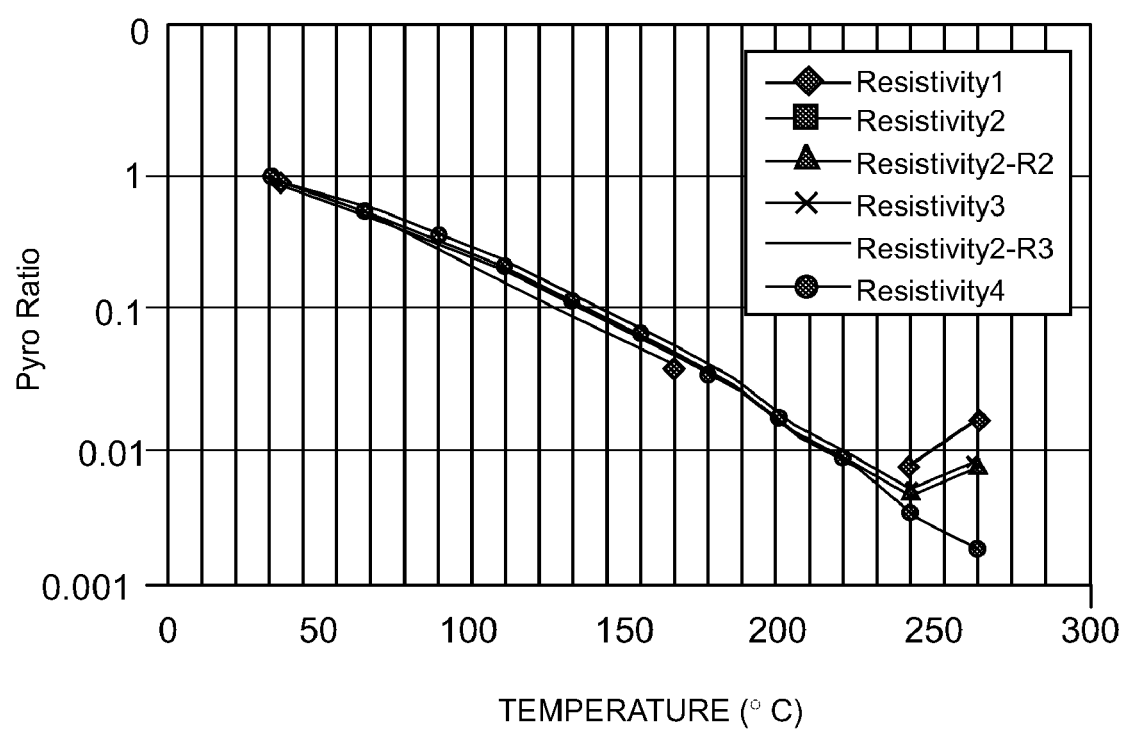
FIG. 10 shows a graph of the ratio of light at 1.03 µm to light at 1.08 µm as a function of temperature for substrates having different resistivities.

FIG. 10 shows a experimental data of a 1030 nm laser transmission signal and a 1080 nm laser transmission signal collected over temperatures from about 25° C. to 250° C. through various types of silicon. The resistivity of the various silicon samples ranged from very high (>50 ohm-cm) to very low (on the order of mili-ohms-cm). When the ratio of the 1030 nm laser signal to the 1080 nm laser signal is plotted as a function of the silicon temperature all curves corresponding to different silicon types overlap into a single curve. This data shows that the doping effect is removed by evaluating the ratio of the pyrometry signals. There are at least two processes to which embodiments of the invention may be applied, almost room-temperature pyrometry and open-loop tuning, also referred to as pre-heating. Almost room-temperature pyrometry, according to embodiments of the invention, uses preferably multiple, radially arranged transmission pyrometers within the feedback loop of a thermal control system in an architecture similar to that used with radiation pyrometry at higher temperatures. Accurate thermal control is possible at temperatures below 250° C., as is contemplated for several advanced integrated circuit structures. It would be desirable for such low-temperature operation to fabricate photodetectors and filters more appropriate for the longer wavelengths, e.g. InGaAs photodetectors and interference filter, since the described silicon photodiode exhibits poor performance at wafer temperatures of greater than about 300° C. As stated before, it would be desirable that an RTP chamber have the capability of both low-temperature and high-temperature processing with thermal feedback control operable at all wafer temperatures.

For low-temperature pyrometry, it may be desirable to provide a light source for the transmitted radiation separate from the heating lamps. The light source may be a laser, LED, a separate low-intensity incandescent bulb or any other suitable light source.

Figure 11:
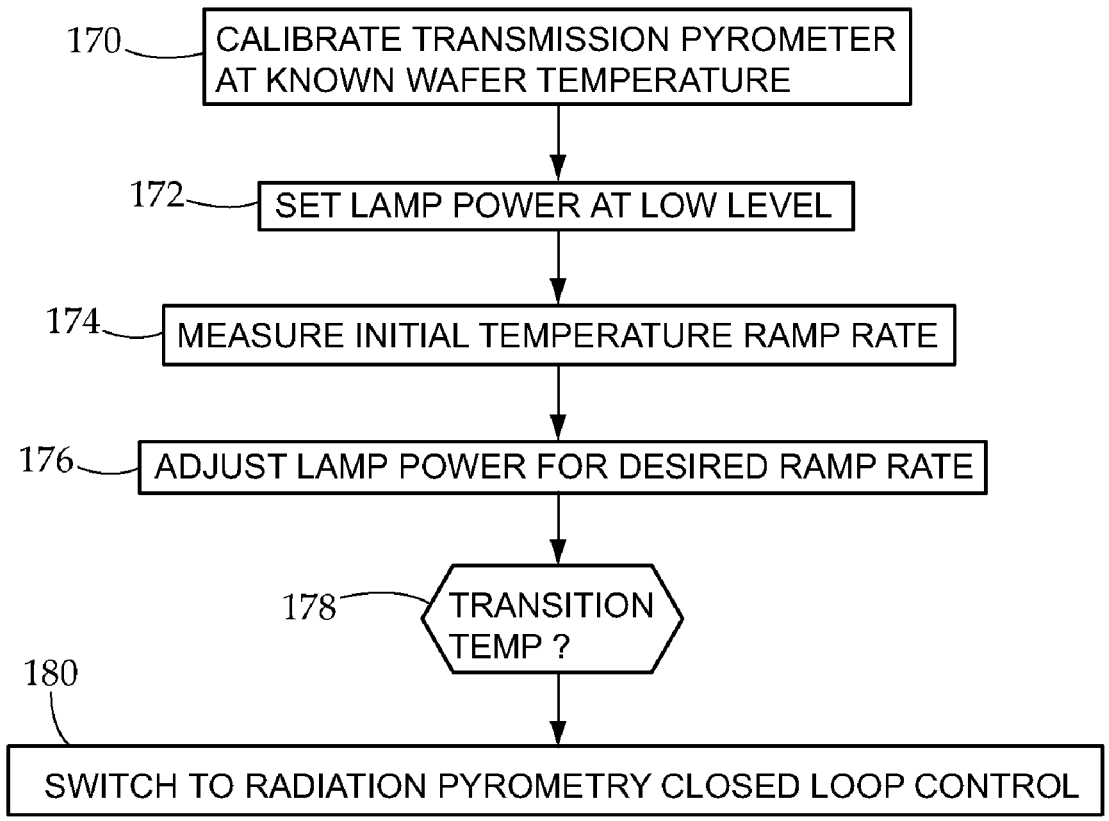
FIG. 11 is a process flow diagram for another method of using a transmission pyrometer to control heating rate in an RTP chamber including adjusting lamp power in view of a measure initial temperature ramp rate.

Aspects of the invention may also be applied in conjunction with standard high-temperature RTP to more closely control the pre-heat phase (also called open loop tuning) without involvement of the radiation pyrometers. A simple pre-heating process is illustrated in the flow diagram of FIG. 11. After a wafer at known temperature is inserted into the RTP reactor, in step 170, the transmission pyrometer is calibrated by establishing the normalization factor for the look-up table or other method of storing the characteristics of the system. Calibration of the transmission pyrometer may include measuring reference intensities and correcting for background or matrix effects. In step 172, the RTP lamps are set to a predetermined low power level, for example, at 15% of full high-temperature levels, which produces a relatively slow heating rate of less than 10° C./s. In step 172, the calibrated transmission pyrometer measures the wafer temperature at least twice after the lamps have been set to their low power level and in step 174 thereby measures the initial ramp rate of the temperature as the wafer heats during the interval between the two measurements. In step 176, the power supply controller calculates adjusted lamp power levels which will change the temperature ramp rate from the initially measured one to a desired temperature ramp rate, which may a set value in the range of 10 to 20° C./s. Thereafter, the pre-heating continues until step 178 determines that the wafer temperature has reached a transition temperature at which the control is switched in step 180 to closed loop control primarily relying upon the radiation pyrometers, as is done in conventional high-temperature RTP control systems.

The pre-heating after adjustment for the initial ramp rate may be performed in a number of ways. It may rely simply upon elapsed time since the lamp power has been readjusted. Either the transmission pyrometer or the radiation pyrometer may be used to detect when the transition temperature has been reached, a temperature to which both pyrometers are typically sensitive. For even closer control, the transmission pyrometer may be used in a closed loop control system for the pre-heating phase to dynamically adjust the lamp currents to maintain the desired temperature ramp rate during the pre-heating. Further, it is possible to adjust the desired ramp rate for different portions of the pre-heating phase.

Although the above descriptions have focused on a single transmission pyrometer and have mentioned only one lamp power setting, accuracy is improved if multiple transmission pyrometers are positioned at different radii and that some differential zone heating be utilized. For example, one transmission pyrometer may point near the wafer center, a second point near the transition from the wafer to the edge ring, and a third one point only on the edge ring. The lamps may then be divided into at least three similar zones for the pre-heating. In the initial ramp rate adjustment of FIG. 11, three initial temperature ramp rates are measured from the three transmission pyrometers. Then, the lamps in the different heating zones are separately readjusted to obtain typically a common desired ramp rate with perhaps some interpolation in narrow intermediate zones.

The transmission pyrometers according to embodiments of the invention are useful also for the initial pre-heating in which the wafer is warmed to the temperature of the edge ring, for example, about 200° C., while it is supported by the lift pins. Once the wafer has attained this temperature, the lift pins lower it onto the edge ring, which then begins rotating. Radiation pyrometers are nearly useless in this regime, particularly since there is significant light leakage from the lamps around the suspended wafer to the underlying pyrometers.

It is possible to provide separate radiation and transmission pyrometers coupled to different apertures in the reflector plate. However, it is convenient to integrate the two pyrometers by modifying the radiation pyrometer in U.S. Pat. No. 6,406,179 to include an angled partial reflector prior to the radiation pyrometer filter. The reflected radiation is directed to an unfiltered silicon photodetector, which thus acts as the transmission pyrometer.

Figure 12:
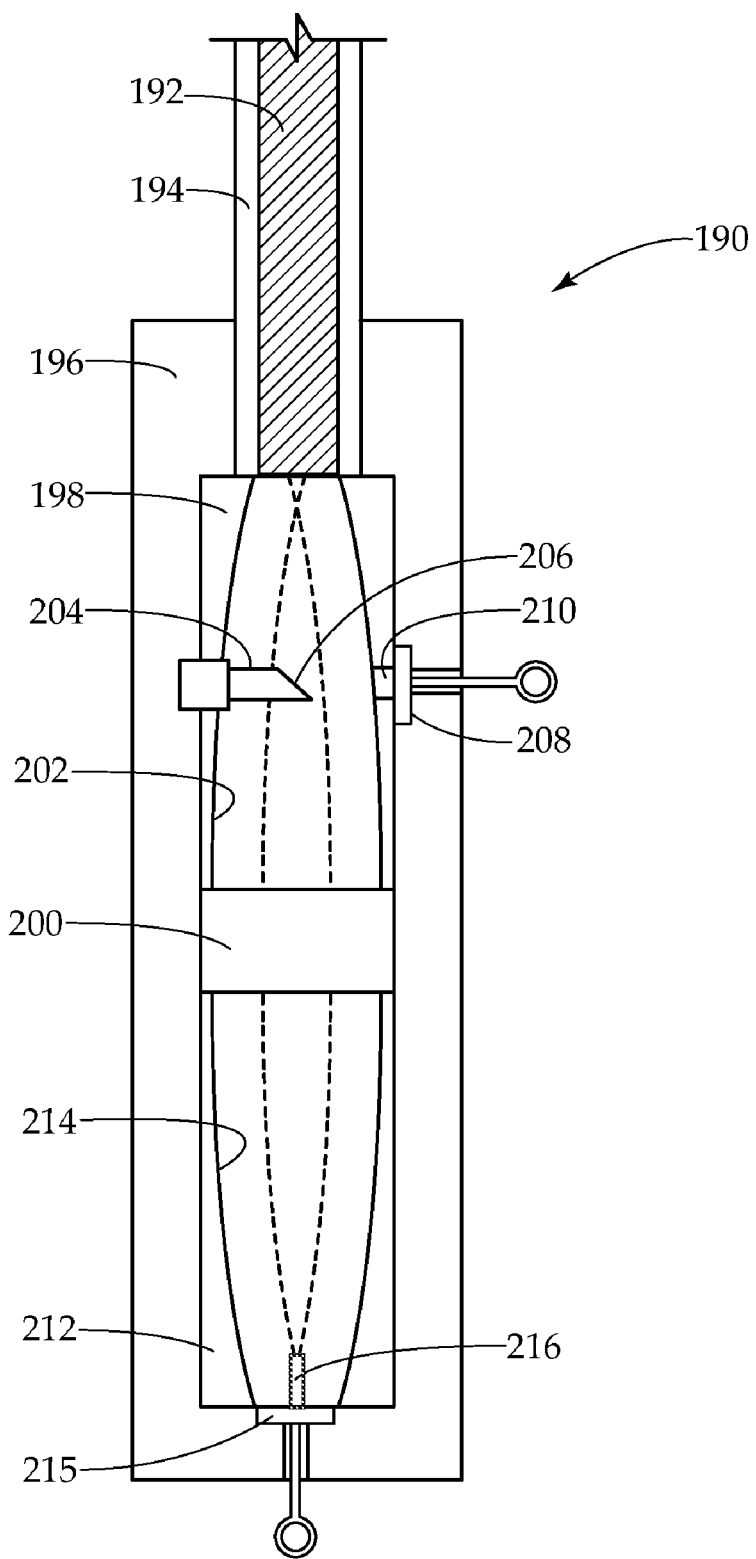
FIG. 12 is a cross sectional view of a combined radiation and transmission pyrometer usefully applied to rapid thermal processing.

An example of a dual pyrometer 190 is illustrated in cross section in FIG. 12. A sapphire light pipe 192 and metal sleeve 194 support the pyrometer 190 at the bottom of the RTP reflector plate. The pyrometer is formed inside a housing 196 which accommodates a collimator 198 having a reflective inner wall 202 flaring radially outwardly from an axial aperture 210 in the collimator 198 adjacent the output of the light pipe 192 to collimate the light pipe radiation to a narrow-band filter 200, typically composed of a multi-layer interference filter. The narrow-band filter 200 is supported in the housing 196 and associated with the radiation pyrometer. However, an adjustable gold-plated pin 204 projects from the collimator wall 202 and has a slanted reflective face to provide beam splitter 206, directing part of the radiation from the light pipe 192 towards a photodetector 208 facing the beam splitter 206 through the aperture 210 in the collimator 198. The photodetector 208 may be a silicon photodiode, in which case it alone may act as the transmission pyrometer for lower wafer temperatures. However, for somewhat higher wafer temperatures, the photodetector 208 may have a longer-wavelength response, such as an InGaAs photodiode, in which case an unillustrated separate transmission pyrometer filter is interposed between the photodetector 208 and the beam splitter 206. The remainder of the radiation passes the beam splitter 206 and is filtered by the radiation pyrometer filter 200 before entering the wide narrow end of a concentrator 212 having an inwardly tapered reflective wall 214 concentrating the filtered radiation toward a second photodetector 215 exposed through a narrow axial aperture 216 at the end of the concentrator 212. The photodetector 215 completes the radiation pyrometer and is typical implemented as a silicon photodiode. Separate electrical leads from the two photodetectors 208, 215 are led to the photodetector power supplies and to the lamp power supply controller to supply the two pyrometer photocurrents.

The described structure advantageously uses existing designs for the RTP reflector plate and its apertures and light pipes. Other structures and other types of beam splitters may be used. Sensitivity is improved with a wavelength-selective beam splitter.

Embodiments of the invention thus provides better low-temperature control of an RTP process, whether it involves an effective thermal process at the low temperature or involves the pre-heating required to attain a higher temperature at which radiation pyrometry is conventionally used. The transmission pyrometer can be easily and economically incorporated into existing designs of high-temperature RTP chambers to extend their temperature range of operation and more closely control the pre-heating phase thus provided an extended temperature pyrometry system.

Figure 13:
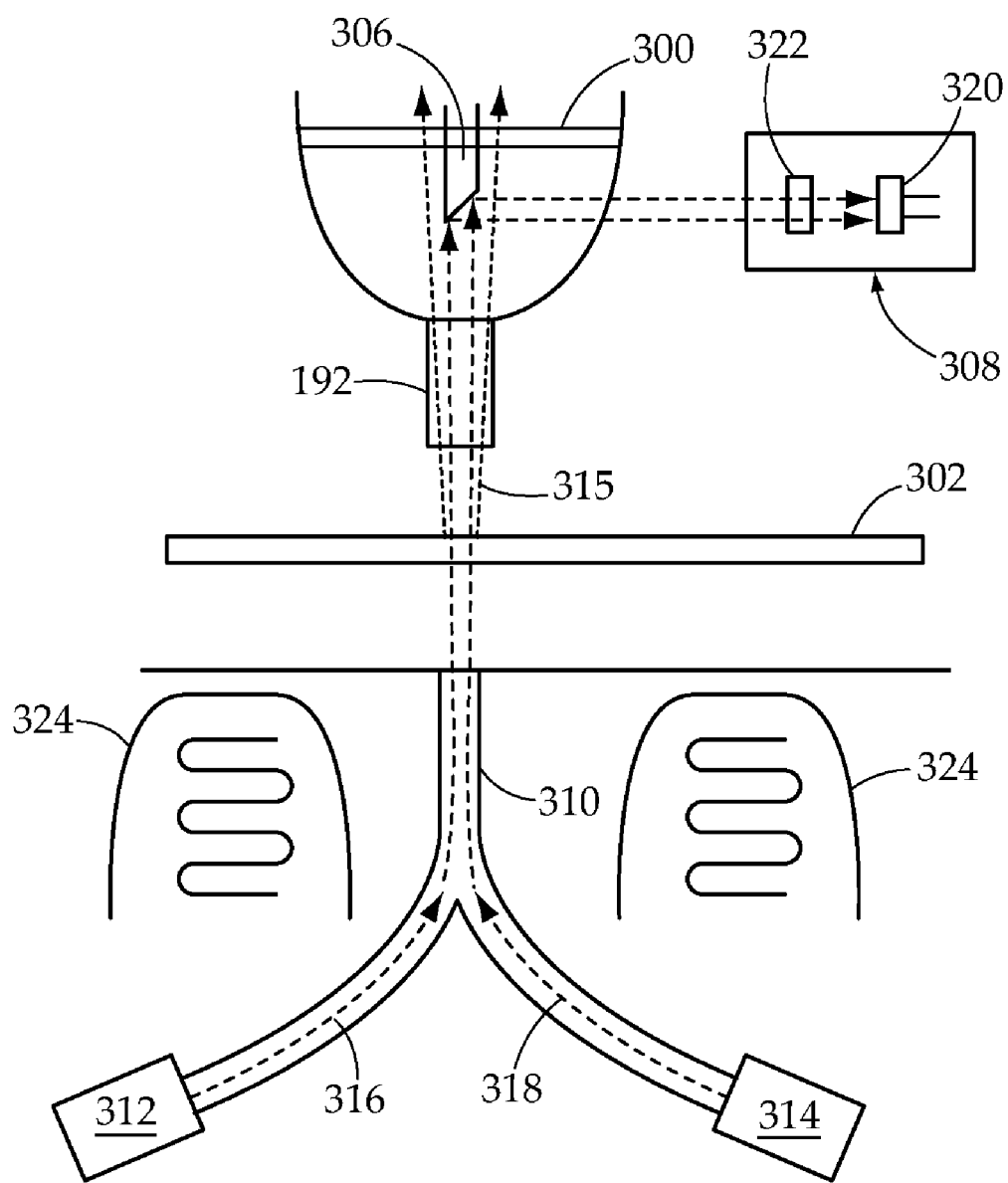
FIG. 13 is a cross sectional view of an RTP chamber according to some embodiments of the invention utilizing a combined radiation and transmission pyrometry system.

Another embodiment of an extended temperature system including a low temperature pyrometry system is shown in FIG. 13. The system as shown includes an emission radiation detector 300 including a beam splitter 306 that measures radiation emitted from the substrate 302 at a first wavelength ($\lambda_1$) 315. The emission radiation detector 300 is not a necessary component in systems that operate at low temperatures, and is an optional component in some systems. For systems that operate and low and high temperatures, both an emission detector 300 and a low temperature system 308 would be included. The radiation source 310 for the low temperature pyrometry system shown in FIG. 13 comprises two discrete light sources 312, 314 that operate at a second wavelength ($\lambda_2$) 316 and third wavelength ($\lambda_3$) 318, and the low temperature detector system 308 comprises a first detector 320 that measures radiation at the first discrete wavelength 316 and second discrete wavelength 318. The two discrete light sources 312, 314 can be operated either sequentially or simultaneously. In some detailed aspects, the second discrete wavelength 316 is about 1030 nm and the third discrete wavelength 318 is about 1080 nm. In other detailed aspects, a wavelength filter 322 in incorporated into the first detector 320 to remove extraneous light. The light sources 312, 314 for creating the discrete wavelengths 316, 318 can be a laser, light-emitting diode, low power incandescent bulb or other suitable light source.

Figure 14:
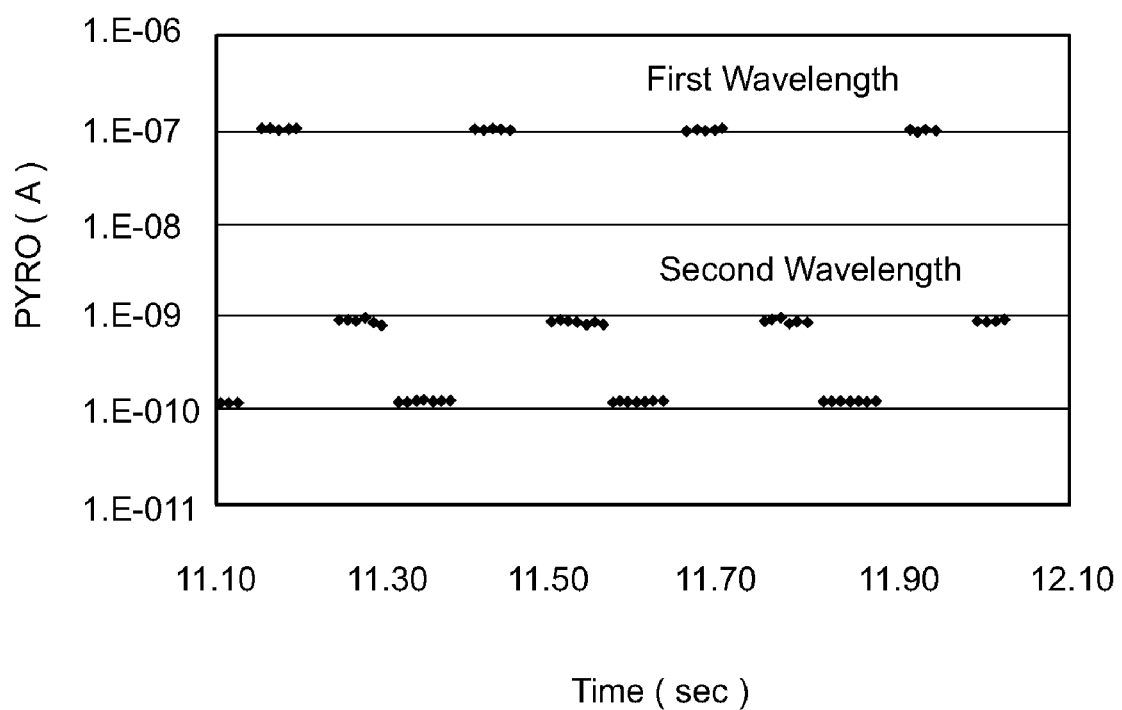
FIG. 14 shows a graph of the time-multiplexed signals from a two laser system according to one or more aspects of the invention.

FIG. 14 shows a graph of time-multiplexed signals when the discrete wavelength sources 312, 314 are operated sequentially. For each cycle, the first wavelength source 312 is turned on first, and the pyrometry signal is recorded. Then the first wavelength source 312 is turned off and the second wavelength source 314 is turned on and the pyrometry signal is measured. After the second wavelength pyrometry is measured, the second wavelength source 314 is turned off, leaving both sources off for a period of time. The time period for each cycle is about 60 msec or less. The cycle then repeats. The pyrometry signals measured for the first wavelength and the second wavelength are subtracted from the background signal (measured when both sources are off) and the ratio determined.

As noted above, a second radiation detector may be included, which is an emission detector 300 configured to measure radiation at a first wavelength ($\lambda_1$) 304, which is the wavelength emitted from the silicon substrate. The second radiation detector measures the wavelength of radiation emitted from silicon, which is about 930 nm. A power supply control system (not shown) coupled to the low temperature pyrometry system can be adapted to control an amount of power delivered to the radiant heat source 324.

Figure 15:
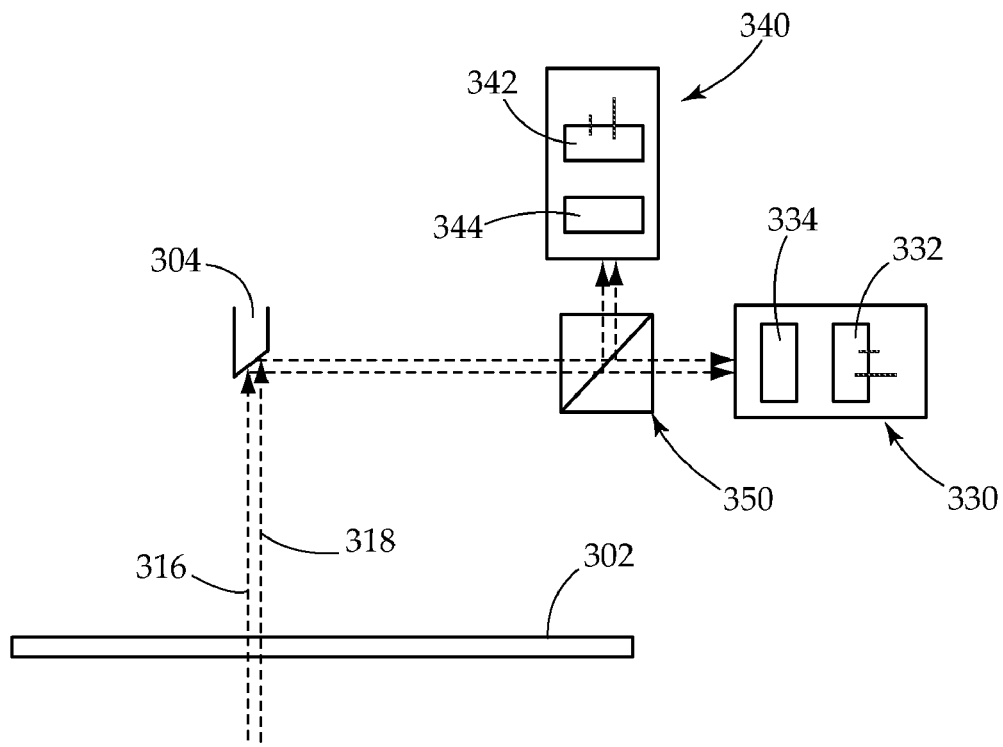
FIG. 15 shows a cross sectional view of a transmission pyrometry system employing a 50:50 beam splitter to split the incoming light.

FIG. 15 shows a variant on the system shown in FIG. 13, where discrete light 316, 318 are transmitted through the substrate 302 and are directed to a transmission pyrometry system by mirror 204. The transmission pyrometry system shown has a first detector module 330 that measures radiation at the first discrete wavelength 316 and a second separate detector module 340 that measures radiation at the second discrete wavelength 318, rather than utilizing a single module that detects at two wavelengths. Both the first detector module 330 and the second detector module 340 have detectors 332, 342 with optional wavelength filters 334, 344. A beam splitter 350 directs half of the discrete light 316, 318 into each of the detector modules 330, 340.

Figure 16:
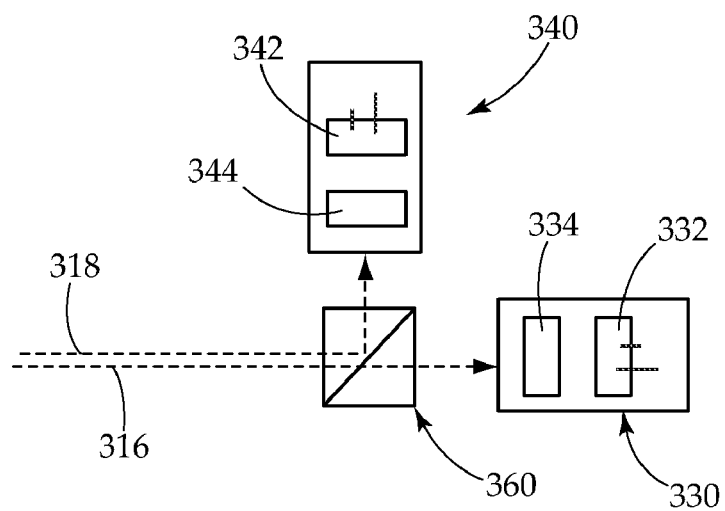
FIG. 16 shows a cross sectional view of a transmission pyrometry system employing a dichroic mirror to split the incoming light.

FIG. 16 shows a variation of the system shown in FIG. 15, where the beam splitter has been replaced with a dichroic mirror 360. The dichroic mirror 360 allows the first discrete wavelength 316 to pass into the first detector module 330 while reflecting the second discrete wavelength 318 toward the second detector module 340.

The wavelength filter used in some embodiments eliminates substantially all of the wavelengths outside the range of several nanometers below the lower of the first discrete wavelength and the second discrete wavelength to several nanometers above the higher of the first discrete wavelength and the second discrete wavelength. Other aspects have the at least one filter comprising a first wavelength filter and a second wavelength filter, the first wavelength filter having a bandpass wide enough to allow the first discrete wavelength to pass and a second wavelength filter having a bandpass wide enough to allow the second discrete wavelength to pass. Further embodiments have a filter that allows substantially all of the light around the first discrete wavelength to pass and gradually attenuates the transmission of light through the filter to 99.9% blocked at wavelengths about the second discrete wavelength. In other aspects the transmitted radiation detector system further comprises at least one wavelength filter effective to remove substantially all radiation having a wavelength less than a predetermined wavelength. In detailed embodiments, the predetermined wavelength is 980 nm.

Additionally, embodiments of the invention are directed to methods of processing a substrate, including measuring reference light intensities emitted from at least one light source at two discrete wavelengths using at least one low temperature pyrometry system at room temperature. The reference light intensities may be measured, for example, in a chamber a chamber that does not include a wafer or substrate in the chamber. The reference intensity measurements can be used to correct for matrix effects, dynamic system properties and background light, for example, as would be understood by those skilled in the art. The ratio of the room temperature intensities of the two discrete wavelengths is calculated. The substrate is placed into the chamber in a position between the at least one light source and the at least one low temperature pyrometry system. The light intensity is measured at the two discrete wavelengths transmitted from the at least one light source through the substrate using the low temperature pyrometry system. The ratio of the intensities of the two discrete wavelengths transmitted through the substrate is calculated and normalized to the intensity ratio at room temperature. The substrate is then heated using a radiant heat source while monitoring the temperature of the substrate by periodically measuring the ratio of the light intensity at the discrete wavelengths transmitted through the substrate using the low temperature pyrometry system.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A rapid thermal processing apparatus for processing a substrate having a front side and a back side, the apparatus comprising:
   a chamber including a radiant heat source;
   a support member to hold the substrate during thermal processing in a position such that one of the front side and back side of the substrate faces the radiant heat source;
   a pyrometry system including a transmitted radiation detector system to measure radiation transmitted from a radiation source through the substrate, the radiation source comprising two discrete light sources that transmit radiation at first and second discrete wavelengths and a first detector module that measures transmitted radiation at the first discrete wavelength and the second discrete wavelength and compares intensity of the transmitted radiation at the first discrete wavelength to the intensity of transmitted radiation at the second discrete wavelength.

2. The apparatus of claim 1, further comprising at least one wavelength filter.

3. The apparatus of claim 1, wherein the radiation source is aligned with the pyrometry system.

4. The apparatus of claim 1, wherein the detector system comprises a first detector module to measure radiation at the first discrete wavelength and a second detector module to measure radiation at the second discrete wavelength.

5. The apparatus of claim 2, wherein the at least one wavelength filter eliminates substantially all of the wavelengths outside the range of several nanometers below the lower of the first discrete wavelength and the second discrete wavelength to several nanometers above the higher of the first discrete wavelength and the second discrete wavelength.

6. The apparatus of claim 2, wherein the at least one wavelength filter comprises a first wavelength filter and a second wavelength filter, the first wavelength filter having a bandpass wide enough to allow the first discrete wavelength to pass and a second wavelength filter having a bandpass wide enough to allow the second discrete wavelength to pass.

7. The apparatus of claim 2, wherein the at least one wavelength filter allows substantially all of the light around the first discrete wavelength to pass and gradually attenuates the transmission of light through the filter to 99.9% blocked at wavelengths about the second discrete wavelength.

8. The apparatus of claim 1, further comprising an emission radiation detector system comprising a pyrometer to measure radiation emitted from the substrate.

9. The apparatus of claim 8, further comprising a beam splitter to separate a portion of the radiation emitted from the substrate from the radiation transmitted through the substrate.

10. The apparatus of claim 1, wherein the two discrete light sources are operated sequentially.

11. The apparatus of claim 1, wherein the two discrete light sources are operated simultaneously.

12. The apparatus of claim 1, further comprising a power supply control system, coupled to the pyrometry system, to control an amount of power delivered to the radiant heat source.

13. The apparatus of claim 1, wherein the transmitted radiation detector system further comprises at least one wavelength filter effective to remove substantially all radiation having a wavelength less than a predetermined wavelength.

14. The apparatus of claim 13, wherein the predetermined wavelength is 980 nm.

15. The apparatus of claim 1, further comprising a plurality of transmitted radiation detector systems.

16. The apparatus of claim 1, wherein the first discrete wavelength is about 1030 nm and the second discrete wavelength is about 1080 nm.

17. The apparatus of claim 8, wherein the emission radiation detector is configured to measure the radiation at about 930 nm.

18. The apparatus of claim 1, wherein the discrete light source comprises a laser.

19. The apparatus of claim 1, wherein the discrete light source comprises a light-emitting diode (LED).

20. A method of processing a substrate, the method comprising:
    measuring a reference light intensity at room temperature from at least two discrete light sources at two discrete wavelengths using at least one pyrometry system;
    calculating the ratio of the room temperature intensities of the two discrete wavelengths;
    placing the substrate into the chamber in a position between the at least two discrete light sources and the at least one pyrometry system;
    measuring the light intensity at the two discrete wavelengths transmitted from the at least two discrete light source through the substrate using the pyrometry system;
    calculating the ratio of the intensities of the two discrete wavelengths transmitted through the substrate and normalizing to the intensity ratio at room temperature; and
    heating the substrate using a radiant heat source while monitoring the temperature of the substrate by periodically measuring the ratio of the light intensity at the discrete wavelengths transmitted through the substrate using the pyrometry system.

* * * * *